United States Patent
Balakrishnan et al.

(10) Patent No.: US 10,153,725 B2
(45) Date of Patent: Dec. 11, 2018

(54) FIBER COUPLED SOLAR CELL MODULES FOR CONCENTRATED OPERATION IN CONSUMER ELECTRONICS APPLICATIONS

(71) Applicant: STC.UNM, Albuquerque, NM (US)

(72) Inventors: Ganesh Balakrishnan, Albuquerque, NM (US); Christopher Hains, Albuquerque, NM (US); Andrew Aragon, Albuquerque, NM (US)

(73) Assignee: STC.UNM, Albuquerque, NM (US)

( * ) Notice: Subject to any disclaimer, the term of this patent is extended or adjusted under 35 U.S.C. 154(b) by 26 days.

(21) Appl. No.: 15/114,374

(22) PCT Filed: Jan. 30, 2015

(86) PCT No.: PCT/US2015/013781
§ 371 (c)(1),
(2) Date: Jul. 26, 2016

(87) PCT Pub. No.: WO2015/116935
PCT Pub. Date: Aug. 6, 2015

(65) Prior Publication Data
US 2016/0344336 A1 Nov. 24, 2016

Related U.S. Application Data

(60) Provisional application No. 61/934,004, filed on Jan. 31, 2014, provisional application No. 61/934,011, filed on Jan. 31, 2014.

(51) Int. Cl.
*H02J 7/00* (2006.01)
*H02S 40/22* (2014.01)
(Continued)

(52) U.S. Cl.
CPC ............... *H02S 40/22* (2014.12); *G02B 6/42* (2013.01); *H01L 31/0547* (2014.12);
(Continued)

(58) Field of Classification Search
CPC ....................................................... H02J 7/35
(Continued)

(56) References Cited

U.S. PATENT DOCUMENTS 4,201,197 A 5/1980 Dismer
4,943,125 A 7/1990 Laundre et al.
(Continued)

FOREIGN PATENT DOCUMENTS

WO 2012-097260 A2 7/2012

OTHER PUBLICATIONS

International Search Report and Written Opinion dated Apr. 29, 2015 from International Application No. PCT/US2015/013781, pp. 1-11.

*Primary Examiner* — Edward Tso
*Assistant Examiner* — Ahmed Omar
(74) *Attorney, Agent, or Firm* — MH2 Technology Law Group LLP

(57) ABSTRACT

A device includes a body and a rechargeable battery positioned within the body. A solar cell is coupled to the body and in communication with the battery. A connector is coupled to the body and configured to engage a corresponding connector of a fiber optic cable.

19 Claims, 3 Drawing Sheets

(51) Int. Cl.
  *G02B 6/42* (2006.01)
  *H01L 31/054* (2014.01)
  *H02S 40/32* (2014.01)
  *H02S 40/38* (2014.01)
  *H02J 7/35* (2006.01)
  *F21V 8/00* (2006.01)

(52) U.S. Cl.
  CPC .............. *H02J 7/355* (2013.01); *H02S 40/32* (2014.12); *H02S 40/38* (2014.12); *G02B 6/0008* (2013.01); *Y02E 10/52* (2013.01)

(58) Field of Classification Search
  USPC ........................................................ 320/101
  See application file for complete search history.

(56) References Cited

U.S. PATENT DOCUMENTS

| | | | |
|---|---|---|---|
| 5,581,447 A | 12/1996 | Raasakka | |
| 5,701,067 A * | 12/1997 | Kaji | A45C 15/00 |
| | | | 136/293 |
| 2013/0141900 A1 | 6/2013 | Lane | |
| 2014/0111135 A1 * | 4/2014 | Idzik | H02J 7/0052 |
| | | | 320/101 |

\* cited by examiner

FIBER COUPLED SOLAR CELL MODULES FOR CONCENTRATED OPERATION IN CONSUMER ELECTRONICS APPLICATIONS

CROSS-REFERENCE TO RELATED APPLICATIONS

This application is a U.S. National Stage Application of PCT/US2015/013781 filed Jan. 30, 2015, which claims priority to U.S. Provisional Patent Application No. 61/934,011, filed on Jan. 31, 2014, and U.S. Provisional Patent Application No. 61/934,004, filed on Jan. 31, 2014. The entirety of both provisional applications and the international application are incorporated by reference herein.

FIELD OF THE INVENTION

This disclosure is generally directed to a system and method for charging a consumer electronics device. More particularly, this disclosure is directed to a system and method for rapidly charging a consumer electronics device using concentrated solar energy.

BACKGROUND OF THE INVENTION

Solar energy may provide an alternative power source for charging consumer electronics devices. Solar charging systems may include one or more discrete solar panels that convert light into current (e.g., photocurrent). The current may be transmitted to a consumer electronics device through a conventional universal serial bus ("USB") cable. This method tends to charge consumer electronics devices very slowly.

More recently, some consumer electronics devices have a solar panel coupled directly thereto. For example, a solar panel may be coupled to the back side of a cell phone. Thus, no cable is needed. While this method allows a user to charge a consumer electronics device anywhere where sunlight is available, it also tends to charge devices very slowly. In addition, this method requires the device to be placed in direct sunlight, which may heat the device. As a result, the device may potentially burn the user. Moreover, the heat may decrease the lifetime of the device.

SUMMARY

A device includes a body and a rechargeable battery positioned within the body. A solar cell is coupled to the body and in communication with the battery. A connector is coupled to the body and configured to engage a corresponding connector of a fiber optic cable.

A system for charging a device using solar energy is also disclosed. The system may include a receiver configured to receive sunlight and to focus the sunlight to an area where the sunlight is concentrated. A fiber optic cable is coupled to the receiver. The fiber optic cable is configured to receive the concentrated sunlight. A device includes a rechargeable battery and a solar cell in communication with the battery. The fiber optic cable is configured to transmit the concentrated sunlight to the solar cell, and the solar cell is configured to convert the concentrated sunlight into current to charge the battery.

A method for charging a device using solar energy is also disclosed. The method includes coupling a fiber optic cable to a device. The device includes a rechargeable battery and a solar cell in communication with the battery. The fiber optic cable is configured to receive concentrated sunlight from a receiver and to transmit the concentrated sunlight to the solar cell, and the solar cell is configured to convert the concentrated sunlight into current to charge the battery.

Additional advantages of the embodiments will be set forth in part in the description which follows, and in part will be understood from the description, or may be learned by practice of the invention. The advantages will be realized and attained by means of the elements and combinations particularly pointed out in the appended claims. It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate embodiments of the invention and together with the description, serve to explain the principles of the invention.

DESCRIPTION OF THE EMBODIMENTS

Reference will now be made in detail to the present embodiments, examples of which are illustrated in the accompanying drawings. Wherever possible, the same reference numbers will be used throughout the drawings to refer to the same or like parts.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less that 10" can assume negative values, e.g., −1, −2, −3, −10, −20, −30, etc. As used herein, the phrase "one or more of", for example, A, B, and C means any of the following: either A, B, or C alone; or combinations of two, such as A and B, B and C, and A and C; or combinations of three A, B and C.

The following embodiments are described for illustrative purposes only with reference to the Figures. Those of skill in the art will appreciate that the following description is exemplary in nature, and that various modifications to the parameters set forth herein could be made without departing from the scope of the present invention. It is intended that the specification and examples be considered as examples only. The various embodiments are not necessarily mutually exclusive, as some embodiments can be combined with one or more other embodiments to form new embodiments.

Figure 1:
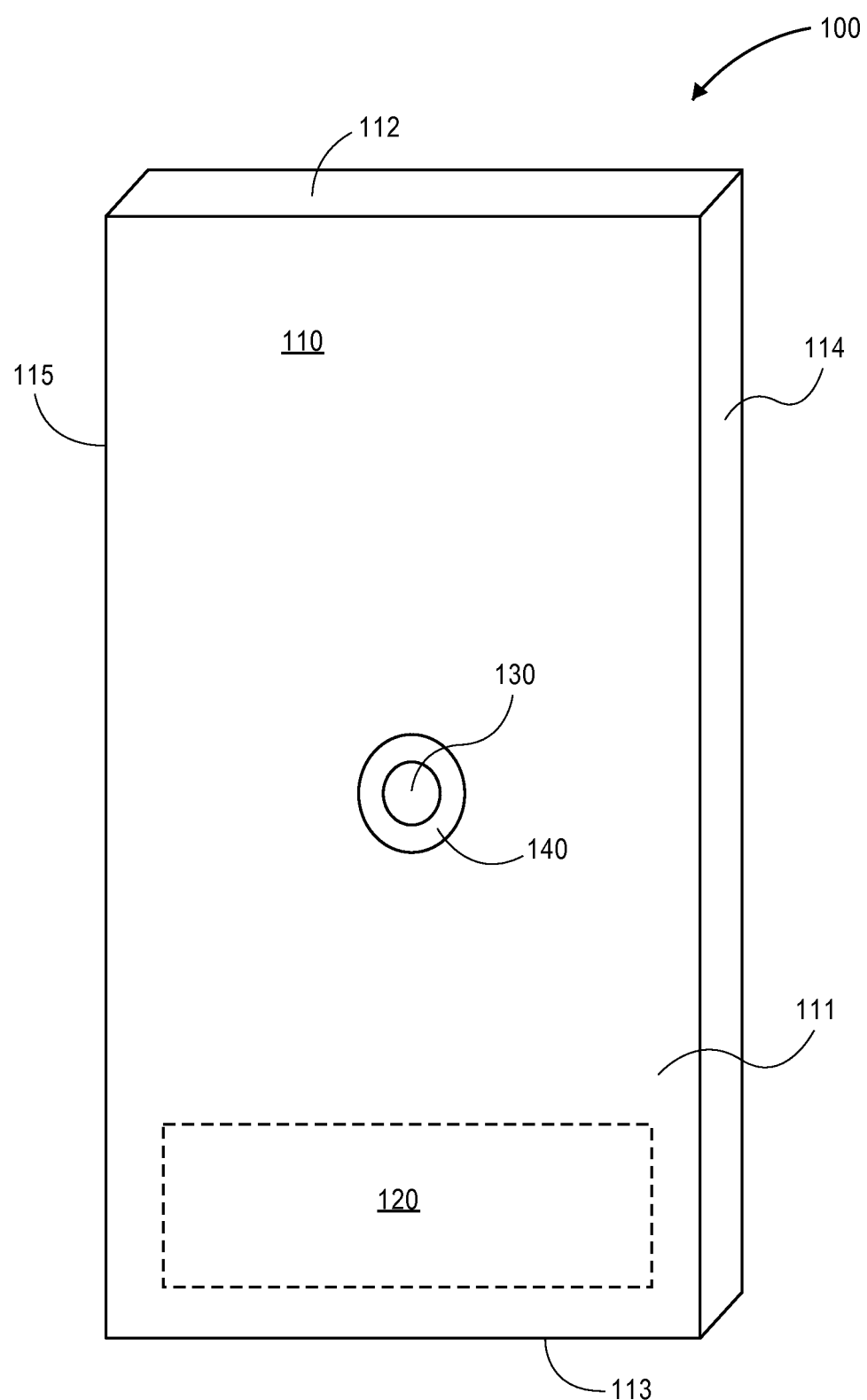
FIG. 1 depicts a perspective view of a consumer electronics device having a solar cell coupled thereto, according to an embodiment.

FIG. 1 depicts a perspective view of a consumer electronics device 100 having a solar cell 130 coupled thereto, according to an embodiment. Illustrative consumer electronics devices 100 may include cell phones, laptops, tablets, audio players (e.g., MP3 players), home appliances (e.g., televisions, stereos, toasters), and the like. The consumer electronics device 100 includes a body 110 having a rechargeable battery 120 positioned therein (shown in dashed lines).

The consumer electronics device 100 also includes a solar cell 130 coupled to the body 110 and in communication with the battery 120. The solar cell 130 may be configured to convert light into current (e.g., photocurrent) that charges or recharges the battery 120. As shown, the solar cell 130 may be positioned on a back side 111 of the device 100 (e.g., the side not including the screen). In other embodiments, the solar cell 130 may be positioned on the top side 112, the bottom side 113, the left side 114, the right side 115, or the front side (not shown).

The cross-sectional area of the solar cell 130 may be from about 0.05 cm$^2$ to about 2 cm$^2$. For example, the cross-sectional area of the solar cell 130 may be from about 0.05 cm$^2$ to about 0.5 cm$^2$, about 0.5 cm$^2$ to about 1 cm$^2$, or about 1 cm$^2$ to about 2 cm$^2$. A ratio of the cross-sectional area of the solar cell 130 to the cross-sectional area of the side of the device 100 to which it is attached (e.g., the back side 111) may be from about 1:100 to about 1:4. For example, the ratio may be from about 1:100 to about 1:50, about 1:50 to about 1:20, or about 1:20 to about 1:4.

The consumer electronics device 100 also includes a connector 140. The connector 140 may be positioned proximate to the solar cell 130. For example, the connector 140 may at least partially surround the solar cell 130. In at least one embodiment, the connector 140 may be a "female" connector (i.e., a recess) that is configured to receive a corresponding "male" connector of a charging cable.

Figure 2:
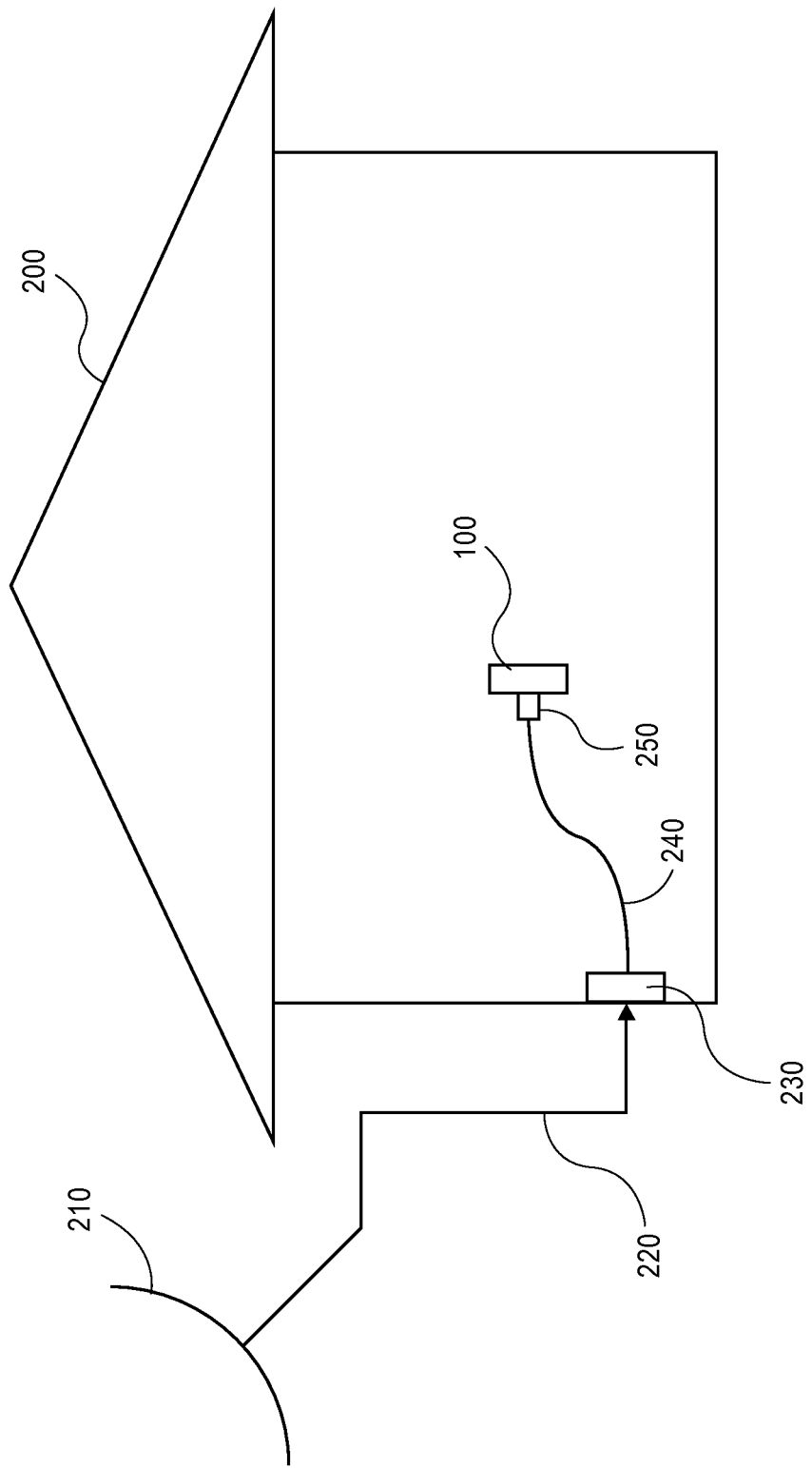
FIG. 2 depicts a schematic view of the consumer electronics device being charged indoors using solar energy, according to an embodiment.

FIG. 2 depicts a schematic view of a consumer electronics device 100 being charged indoors using solar energy, according to an embodiment. A receiver 210 may be positioned outdoors in a location where the receiver 210 is in a path of direct sunlight. The receiver 210 may be or include a parabolic mirror, a Fresnel lens, a lens array, and he like. The receiver 210 may include one or more reflectors that focus (e.g., concentrate) the sunlight to a point. The point may have a cross-sectional area that is less than or equal to about 10 cm$^2$, about 5 cm$^2$, or about 1 cm$^2$.

A fiber optic cable 220 may be coupled to the point on the receiver 210 and configured to receive the concentrated light. As shown, the fiber optic cable 220 may extend from the receiver 210, through a wall of a building 200, and to a receptacle 230 inside the building 200. A second fiber optic cable 240 may extend from the receptacle 230. The second fiber optic cable 240 may include a connector 250 on an end thereof The connector 250 on the second fiber optic cable 240 may be configured to be inserted into the corresponding connector 140 of the device 100. For example, the connector 250 of the second fiber optic cable 240 may be a "male" connector.

Figure 3:
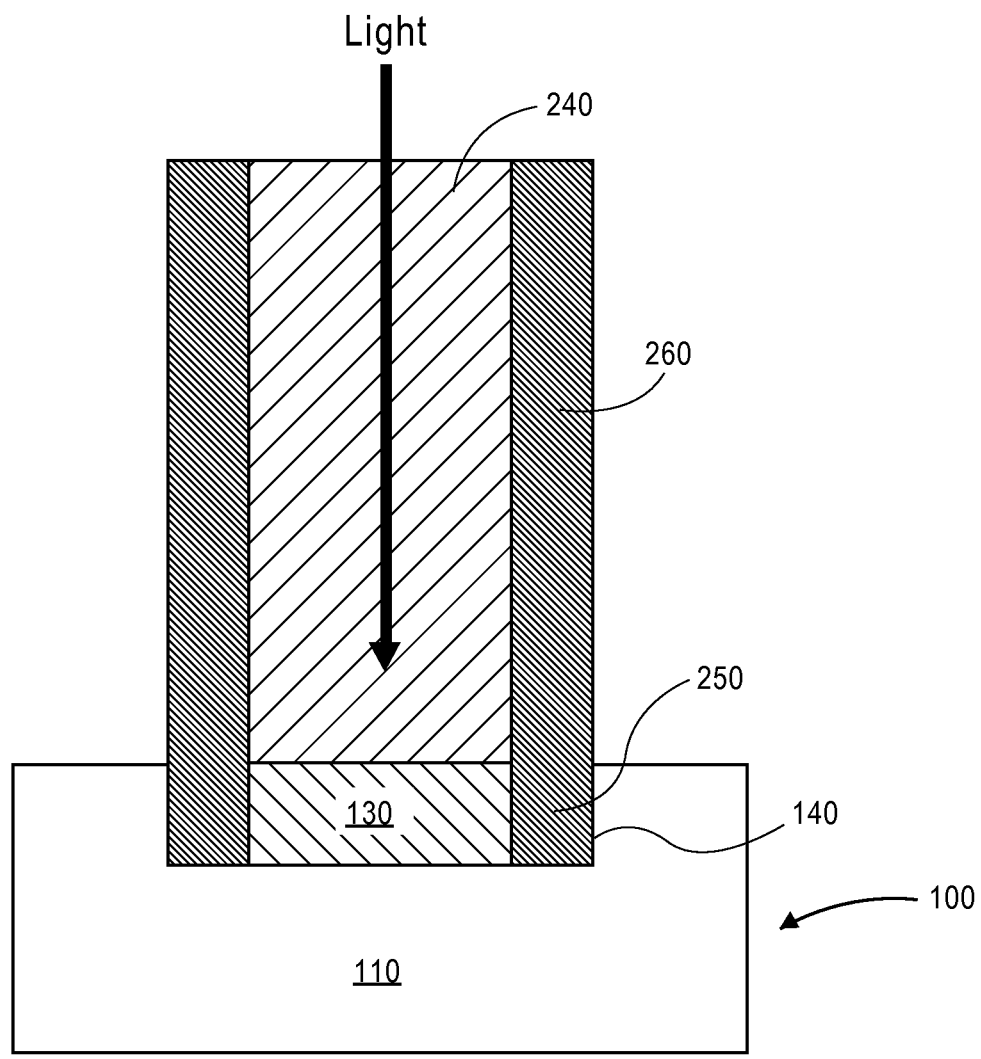
FIG. 3 depicts a schematic cross-sectional view of a fiber optic cable coupled to the consumer electronics device, according to an embodiment.

FIG. 3 depicts a schematic cross-sectional view of the fiber optic cable 240 coupled to the consumer electronics device 100, according to an embodiment. A protective sleeve 260 may surround the fiber optic cable 240. The sleeve 260 may prevent the fiber optic cable 240 from being damaged while also preventing the light or energy from escaping.

When the connector 250 on the fiber optic cable 240 is engaged with the connector 140 on the device 100, the fiber optic cable 240 may be substantially aligned with the solar cell 130. As shown, the fiber optic cable 240 may be in contact with the solar cell 130. In other embodiments, the fiber optic cable 240 may be spaced apart from the solar cell 130 from about 0.1 mm to about 5 mm.

In operation, sunlight may shine on the receiver 210, which may focus (e.g., concentrate) the sunlight into the first fiber optic cable 220. The concentrated light may travel through the fiber optic cable 220 to the receptacle 230. The receptacle 230 may transfer the concentrated light from the first fiber optic cable 220 into the second fiber optic cable 240. In at least one embodiment, the receptacle 230 may be omitted and a single fiber optic cable may be used. The concentrated light may be transmitted through the (e.g., second) fiber optic cable 240 to the solar cell 130 on the device 100, which may convert the light into current (e.g., photocurrent). The current may, at times, be from 0.1 amp/cm$^2$ to about 1 amp/cm$^2$, about 1 amp/cm$^2$ to about 2 amps/cm$^2$, about 2 amps/cm$^2$ to about 5 amps/cm$^2$, or more, depending on the intensity of the sunlight and the size and type of receiver 210 used. The corresponding output voltage may be from about 0.5 volts to about 2 volts, about 2 volts to about 4 volts, about 4 volts to about 10 volts, or more, depending on the intensity of the sunlight and the size and type of receiver 210 used. Thus, the battery 120 of the device 100 may be charged without directly exposing the device 100 (or the solar cell 130) to sunlight. As such, the battery 120 may be recharged while the device 100 is indoors.

By focusing the light into the fiber optic cable 240, the solar cell 130 may be driven in a concentrator mode as opposed to a single sun mode. As a result, the light may generate a higher current in the device 100 than is generated through conventional solar methods. This may lead to faster charging of the battery 120 of the device 100.

In addition, conventional solar systems used to charge the battery in a consumer electronics device often lose a portion of the light to reflection off of the solar cell. Some of these conventional systems even include an anti-reflection coating to lessen this effect; however, a portion of the light is still lost. In contrast, here, concentrated light is transmitted through the fiber optic cable 240 to the solar cell 130. The only place for the light to reflect is back into the fiber optic cable 240, which is minimal In at least one embodiment, a medium may be placed between the fiber optic cable 240 and the solar cell 130. The medium may be a liquid, a cement (e.g., an adhesive), or a gel having an index of refraction that closely approximates that of the fiber optic cable 240, the solar cell 130, or both. This may further reduce losses due to reflection.

While the present teachings have been illustrated with respect to one or more implementations, alterations and/or modifications may be made to the illustrated examples without departing from the spirit and scope of the appended claims. For example, it will be appreciated that while the process is described as a series of acts or events, the present teachings are not limited by the ordering of such acts or events. Some acts may occur in different orders and/or concurrently with other acts or events apart from those described herein. Also, not all process stages may be required to implement a methodology in accordance with one or more aspects or embodiments of the present teachings. It will be appreciated that structural components and/or processing stages may be added or existing structural components and/or processing stages may be removed or modified. Further, one or more of the acts depicted herein may be carried out in one or more separate acts and/or phases.

Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items may be selected. Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "about" indicates that the value listed may be somewhat altered, as long as the alteration does not result in nonconformance of the process or structure to the illustrated embodiment. The term "conformal" describes a coating material in which angles of the underlying material are preserved by the conformal material. Terms of relative position as used in this application are defined based on a plane parallel to the conventional plane or working surface of a workpiece, regardless of the orientation of the workpiece. Finally, "exemplary" indicates the description is used as an example, rather than implying that it is an ideal.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A device, comprising:
   a body;
   a rechargeable battery positioned within the body;
   a solar cell coupled to the body and in communication with the battery, wherein a cross-sectional area of the solar cell is from about 0.05 cm$^2$ to about 2 cm$^2$;
   a connector coupled to the body, wherein the connector is configured to engage a corresponding connector of a fiber optic cable such that, after travelling through the fiber optic cable to the solar cell, the only place for light to reflect is back into the fiber optic cable, and wherein the light comprises concentrated sunlight that enables the solar cell to charge the battery faster than if the solar cell was operating in a single sun mode; and
   a medium positioned between the solar cell and the fiber optic cable to reduce losses due to reflection.

2. The device of claim 1, wherein the fiber optic cable is substantially aligned with the solar cell when the connector of the body is engaged with the connector of the fiber optic cable.

3. The device of claim 1, wherein the connector at least partially surrounds the solar cell, and wherein the solar cell is on a first side of the body, and a screen is on a second, opposing side of the body.

4. The device of claim 1, wherein a ratio of a cross-sectional area of the solar cell to cross-sectional area of a side of the body on which the solar cell is positioned is from about 1:100 to about 1:4.

5. A system for charging a device using solar energy, comprising:
   a receiver configured to receive sunlight and to focus the sunlight to an area where the sunlight is concentrated;
   a fiber optic cable coupled to the receiver, wherein the fiber optic cable is configured to receive the concentrated sunlight; and
   a device comprising:
      a rechargeable battery;
      a solar cell in communication with the battery, wherein a cross-sectional area of the solar cell is from about 0.05 cm$^2$ to about 2 cm$^2$, wherein the fiber optic cable is configured to transmit the concentrated sunlight to the solar cell such that only place for the concentrated sunlight to reflect is back into the fiber optic cable, wherein the solar cell is configured to convert the concentrated sunlight into current to charge the battery, and wherein the concentrated sunlight enables the solar cell to charge the battery faster than if the solar cell was operating in a single sun mode; and
      a medium positioned between the solar cell and the fiber optic cable to reduce losses due to reflection of the concentrated sunlight off of the solar cell.

6. The system of claim 5, wherein the battery of the device is configured to be recharged when the device is not in direct sunlight.

7. The system of claim 5, wherein the battery of the device is configured to be recharged when the device is indoors.

8. The system of claim 5, wherein the fiber optic cable includes a first connector that is configured to engage a second connector on the device.

9. The system of claim 5, wherein the fiber optic cable is substantially aligned with the solar cell when the first and second connectors are engaged.

10. The system of claim 5, wherein the area where the sunlight is concentrated has a cross-sectional area less than or equal to about 10 cm$^2$.

11. The system of claim 5, wherein the current is configured to be from about 0.1 amp/cm$^2$ to about 5 amps/cm$^2$.

12. The system of claim 5, wherein the fiber optic cable comprises a first fiber optic cable coupled to the receiver and a second fiber optic cable coupled to the device, and further comprising a receptacle positioned indoors, wherein the receptacle is configured to transfer the concentrated sunlight from the first fiber optic cable to the second fiber optic cable.

13. A method for charging a device using solar energy, comprising:
   coupling a fiber optic cable to a device, wherein the device comprises:
      a rechargeable battery; and
      a solar cell in communication with the battery, wherein a cross-sectional area of the solar cell is from about 0.05 cm$^2$ to about 2 cm$^2$, wherein the fiber optic cable is configured to receive concentrated sunlight from a receiver and to transmit the concentrated sunlight to the solar cell such that only place for the concentrated sunlight to reflect is back into the fiber optic cable, wherein the solar cell is configured to convert the concentrated sunlight into current to charge the battery, wherein the concentrated sunlight enables the solar cell to charge the battery faster than if the solar cell was operating in a single sun mode, and wherein a medium is positioned between the solar cell and the fiber optic cable to reduce losses due to reflection of the concentrated sunlight off of the solar cell.

14. The method of claim 13, wherein coupling the fiber optic cable to the device comprises inserting a first connector coupled to the fiber optic cable into a second connector coupled to the device.

15. The method of claim 14, wherein the solar cell is surrounded by the first connector, the second connector, or both, such that the fiber optic cable is substantially aligned with the solar cell when the first and second connectors are engaged.

16. The method of claim 15, wherein the receiver is positioned outdoors, and the device is positioned indoors.

17. The device of claim 1, wherein the medium has an index of refraction that closely approximates an index of refraction of the solar cell, the fiber optic cable, or both.

18. The device of claim 17, the medium is selected from the group consisting of a liquid, a cement, and a gel.

19. The system of claim 5, wherein the receiver comprises one or more reflectors that concentrate the sunlight to a point having a cross-sectional area that is less than or equal to about 1 $cm^2$, and wherein the fiber optic cable is coupled to the point.

\* \* \* \* \*